Dec. 20, 1960 C. E. FAY 2,965,863

MAGNETIC TUNED CAVITY RESONATOR

Filed June 19, 1956 2 Sheets-Sheet 1

INVENTOR
C. E. FAY
BY Roy M. Porter, Jr.
ATTORNEY

MAGNETIC TUNED CAVITY RESONATOR

Filed June 19, 1956

INVENTOR
C. E. FAY
BY Roy M. Porter, Jr.

ATTORNEY

United States Patent Office 2,965,863
Patented Dec. 20, 1960

2,965,863

MAGNETIC TUNED CAVITY RESONATOR

Clifford E. Fay, Chatham, N.J., assignor to Bell Telephone Laboratories, Incorporated, New York, N.Y., a corporation of New York Filed June 19, 1956, Ser. No. 592,367
7 Claims. (Cl. 333—82)

This invention relates to tuned microwave circuits of the cavity resonator type and, more particularly, to a magnetic tuner for rapidly varying the frequency of such resonators over a wide frequency range.

The desirability of electrical means for tuning an electromagnetic wave system has been apparent for some time. For example, a very simple but particularly useful application of electrical tuning is found in a system in which the frequency of a microwave oscillator, for example, a klystron, must be controlled by an electrical signal to obtain automatic frequency control characteristics. As is well known, serious problems are encountered in such a system when the electrical signal is utilized to produce mechanical tuning. Such a system, if possible at all, is cumbersome, expensive and has a slow rate of responsive. An electrical tuning arrangement directly utilizing the control signal will, therefore, greatly simplify the problem. Some of the other obvious applications of such a tuner are in frequency-swept oscillators and in variably tuned microwave filters. Recently the properties of magnetically polarized elements of material exhibiting the gyromagnetic effect at wave energy frequencies within the operating range of frequencies, often designated ferrites, have been utilized to provide such a tuner. Hereinafter, when the term gyromagnetic material, or medium, is used, the more completely descriptive definition given above will be implied. A variation in the magnetic field applied to such an element changes its effective permeability in accordance with a theory developed by D. Polder, "Philosophical Magazine," vol. 40, pages 99 through 115, January 1949. If such a permeable medium is included within a resonant cavity, the electrical size of the cavity, and hence its resonant frequency, can be changed by means of a variable magnetic tuning field. This tuning field may be supplied by an electrical solenoid which directly utilizes an electrical control signal. However, the range of frequencies over which such a ferrite loaded cavity can be tuned is limited by the residual magnetic properties of the ferrite material when the tuning field is zero. Consequently, ferrite tuned microwave cavities have been limited to those applications in which a restricted tuning range would provide the desired degree of flexibility.

It is therefore an object of the present invention to extend the tuning range of cavity resonators of the magnetically tuned type.

It is a more specific object of the invention to reduce or eliminate the residual magnetic effects within gyromagnetic material used to tune a resonant cavity.

In accordance with the present invention, means are provided for effectively reducing the residual magnetic properties of an unpolarized gyromagnetic medium partially filling a conductively bounded resonant cavity and thereby extending the tuning range of such a cavity. More particularly, a second or subsidiary magnetic field, hereinafter termed the compensating field, is applied to the gyromagnetic medium at right angles to the tuning field to reduce or substantially eliminate residual electron spin alignment with the tuning field. The effect of this field can be better understood by considering the nature of the gyromagnetic phenomenon in such a medium. When the tuning field is applied, the magnetic moments of the individual electron spins within the gyromagnetic medium tend to align their spin axes with the tuning field. A radio frequency magnetic field applied at right angles to the tuning field causes the electron spins to precess gyroscopically, setting up magnetic flux components in a plane perpendicular to the tuning field. The interaction of these flux components with the magnetic field components of the radio frequency signal results in a certain effective permeability being presented to the radio frequency signal. When the tuning field is removed some of the electron spins tend to remain in a direction perpendicular to the radio frequency magnetic field components due to residual magnetic effects. In the absence of a compensating field these particular electron spins will produce magnetic flux components in the plane of the magnetic field of the radio frequency signal even in the absence of a tuning field and will result in an effective permeability for the gyromagnetic medium which is not unity, as would result without the residual magnetic effects, but some value less than unity. A compensating field applied at right angles to the tuning field in accordance with the present invention will tend to align the electron spins in the direction of this compensating field. When the compensating field is excited along the principal radio frequency magnetic field components in the gyromagnetic medium, it can be seen that no flux interaction can take place because the radio frequency field and the electron spin flux components are in orthogonal planes. Substantially none of the electron spins remain perpendicular to the radio frequency magnetic field and the effective permeability of the gyromagnetic medium is therefore substantially equal to unity. The increase in the range of available permeabilities made possible by the increase in initial permeability results in an extension of the range of resonant frequencies of the cavity.

These and other objects and features, the nature of the present invention and its various advantages, will appear more fully upon consideration of the specific illustrative embodiments shown in the accompanying drawings and described in detail in the following explanation of these drawings.

In the drawings:

Fig. 1 is a perspective view of a first illustrative embodiment of the invention showing a magnetically tuned rectangular cavity having a compensating field in accordance with the principles of the invention;

Fig. 2, given for the purpose of illustration, is a graphical and qualitative representation of the tuning field versus resonant frequency characteristics of the cavity shown in Fig. 1;

Figures 1, 2:
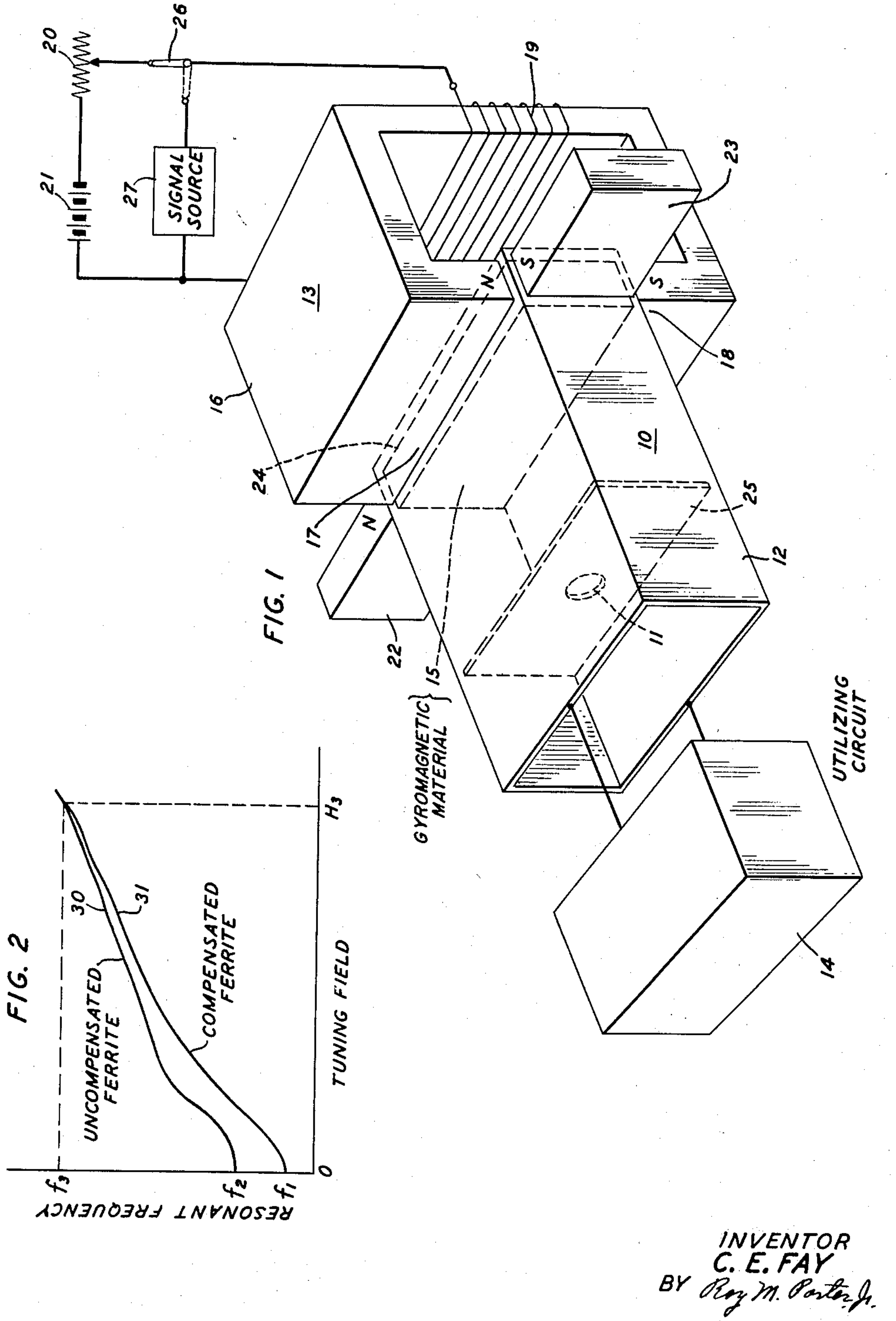

Referring more specifically to Fig. 1, a broadband magnetically tuned resonant circuit is shown as an illustrative embodiment of the present invention. The resonant circuit comprises a conductively bounded rectangular cavity 10 having two broader dimensions and one narrower dimension, preferably capable of being excited only in the dominant $TE_{10\widehat{1}}$ mode such that the electric field vectors are parallel to the narrower walls of the cavity. Under this type of excitation, the electric field intensity in cavity 10 is maximum at the center of the broadest face and falls off to zero at the narrower walls. Furthermore, the magnetic field components form closed loops in planes perpendicular to the narrower walls of cavity 10, and the magnetic field intensity is zero at the center of the broadest face of cavity 10 and maximum at the narrower walls. Cavity 10 may, for example, be a section of rectangular wave guide terminated at both ends by conducting plates 24 and 25. In narrower walls 25 is an aperture 11 coupling cavity 10 to a section of rectangular wave guide 12 which in turn in connected to a utilizing circuit 14. Utilizing circuit 14 represents any of the many microwave circuits which require a microwave signal of variable frequency, such as, for example, a frequency modulated microwave transmission system. Enclosed within and partially filling cavity 10 is a rectangular element 15 of gyromagnetic material positioned adjacent to the narrower wall 24 of cavity 10. Element 15 may, however, lie along any or all of the narrower walls of cavity 10 or any portion thereof, or in any other portion of cavity 10 so long as it is in a region of high magnetic field intensity and low electric field intensity when cavity 10 is excited.

Element 15 is composed of gyromagnetic material such as, for example, ferrite, having electrical and magnetic properties of the type described by the mathematical analysis of D. Polder in "Philosophical Magazine," vol. 40, pages 99 through 115, January 1949. As a specific example of a gyromagnetic medium, element 15 may be made of any of the several ferromagnetic materials combined in a spinel structure. For example, it may comprise iron oxide with a small quantity of one or more of the bivalent metals such as nickel, magnesium, zinc, manganese or other similar material in which the other metals combine with the iron oxide in a spinel structure. This material is known as a ferromagnetic spinel or a ferrite. Frequently, these materials are first powdered and then molded with a small percentage of plastic material, such as Teflon or polystyrene. As a specific example, element 15 may be made of nickel-zinc ferrite prepared in the manner described by C. L. Hogan in his copending application Serial No. 252,432, filed October 22, 1951, now United States Patent 2,748,353, issued May 29, 1956.

Element 15 is magnetically polarized by a magnetic field, hereinafter termed the tuning field, of variable strength directed parallel to the narrower walls of cavity 10 and perpendicular to the magnetic flux loops in cavity 10 when it is excited. As illustrated in Fig. 1, this field may be supplied by a magnetic structure 13 comprising a magnetic core 16 having pole pieces 17 and 18 bearing on opposite walls of cavity 10 in the region of element 15. Turns of wire, for example, turns 19, are so wound on core 16 and connected through a rheostat 20 to a source of energizing current 21 that a north magnetic pole N is produced at pole piece 17 and a south magnetic pole S is produced at pole piece 18 as illustrated in Fig. 1. Magnetic structure 13 may, however, be energized by several other means to be more fully described hereinafter.

In accordance with the present invention, the frequency range of the magnetically tuned cavity resonator illustrated in Fig. 1 is increased by extending the lower frequency limit of the tuning range. More particularly, means are provided for increasing the initial effective permeability of a gyromagnetic element used for electrically tuning a resonant cavity and thereby extending the range of effective permeabilities available for tuning purposes. As illustrated in Fig. 1, one method of increasing the initial effective permeability of a gyromagnetic medium is to provide a second subsidiary magnetic field, hereinafter called the compensating field, at right angles to the tuning field. In Fig 1, rectangular members 22 and 23 are located adjacent to the narrower walls of cavity 10 in the region of element 15. Members 22 and 23 are composed of permanent magnet material and are magnetically polarized such that a north magnetic pole N is formed on member 22 adjacent to one end of element 15 and a south magnetic pole S is formed on member 23 adjacent to the other end of element 15. Members 22 and 23 create a magnetic compensating field in element 15 extending from member 22 to member 23 at right angles to the tuning field generated by magnetic structure 13. The operation of the cavity tuner shown in Fig. 1 can be better understood by a consideration of the gyromagnetic effect of a polarized ferrite medium.

It has been determined that the application of a magnetic field, such as the tuning field provided by magnetic structure 13, to a gyromagnetic medium changes the electrical properties of the medium in a well-defined fashion. It should be recalled that the high frequency magnetic field pattern of a dominant mode wave in a rectangular cavity forms closed loops which lie in planes perpendicular to the narrower dimensions of the cavity. Furthermore, these loops, which represent a portion of a standing wave within the cavity, can be considered as the result of the interaction of two equal but oppositely directed traveling waves of the same frequency. These traveling waves have circularly polarized magnetic field components in the region of cavity 10 adjacent to the narrower walls thereof. When gyromagnetic material is introduced into cavity 10 in the region of the circularly polarized magnetic field components, these components are able to interact with the individual electron spin moments within the gyromagnetic material in a manner fully described in an article entitled "Behavior and Applications of Ferrite in the Microwave Region" by A. G. Fox, S. E. Miller and M. T. Weiss in the Bell System Technical Journal, January 1955, vol. 34, pages 5 through 104. As is therein disclosed, the electron spins which are aligned by the tuning field precess gyroscopically in the presence of he radio frequency magnetic field and produce components of flux in a plane perpendicular to the direction of alignment. The interaction of these flux components with the high frequency magnetic field components in the cavity causes a variation in the effective permeability of the gyromagnetic medium for different values of tuning field.

It has been discovered that when the externally applied field goes to zero, some of the electron spins will remain in alignment, producing a magnetic effect called residual magnetism. These spins are maintained in alignment by their own magnetic moments and can therefore continue the precessional motion and flux interaction even in the absence of the tuning field. When the compensating field is applied, however, the electron spins can no longer align themselves perpendicular to the flux loops when the tuning field goes to zero. On the contrary, the spins align themselves with the effective static magnetic field in element 15 which is the resultant of the tuning field and the compensating field. When the tuning field is large, the compensating field is comparatively small and does not affect the tuning of cavity 10. When the tuning field is small, however, the compensating field becomes significant and tilts the electron spin axes out of the normal to the flux loops and eventually, when the tuning field is zero, into the plane of the flux loops. If the compensating field is large compared to the residual effects, the resulting permeability will be substantially equal to unity at zero tuning field.

As shown in Fig. 1, rheostat 20 and source 21 may be replaced through switch 26 by an electrical signal source 27 from, for example, utilizing circuit 14 itself, representing the difference between the frequency of oscillation of cavity 10 and some desired frequency standard.

In this case it is apparent that the frequency of oscillation of cavity 10 will be changed so as to correspond to the desired frequency standard and hence the structure will act as an automatic frequency control system. Signal source 27 may, as another example, provide a signal of varying amplitude with which it is desired to frequency modulate the oscillations of cavity 10. Signal source 27 may also be a sawtooth wave generator in which case the frequency of oscillation of cavity 10 will sweep through a desired range periodically. It is apparent that such an electrically tuned cavity resonator is useful in a wide variety of applications and for many different purposes.

As is evident in Fig. 1, members 22 and 23 are partially contained in the magnetic field generated by magnetic structure 13 and hence are subject to strong demagnetizing effects perpendicular to their desired direction of magnetization. Members 22 and 23 are therefore composed of material having a large coercive force and a low permeability, enabling them to retain their permanent magnetic properties even while subject to these strong demagnetizing fields. One such group of materials, represented by the trade name "Ferroxdure," is a hexagonal crystalline class of materials having the chemical composition $B_aFe_{12}O_{19}$,$B_aFe_{18}O_{27}$ or other such compound. Due to an unusually high uniaxial magnetic anisotropy along the hexagonal axes, these materials, especially when its crystallites are axially oriented, have the required high retentivity and are therefore eminently suitable for a use such as that contemplated in connection with Fig. 1. A complete discussion of this class of compounds and their general physical and chemical properties is to be found in an article, "Ferroxdure, a Class of New Permanent Magnet Materials" by Went, Rathenau, Gorter and Oosterhaut, Philips Technical Review, January 1952, pages 194 through 208. It should be noted, however, that any other means may be used to produce the compensating field for element 15 in Fig. 1. The compensating field may, for example, be supplied by a second magnetic structure producing a field at right angles to the tuning field. This electrically produced field may be of a constant value or may be arranged such that it becomes increasingly smaller in intensity as the tuning field is increased. Since the compensating field is necessary only in the region of near zero tuning field, it could be dispensed with for the higher tuning field strengths. The effect of the compensating field produced by members 22 and 23 in Fig. 1 can be better seen by considering Fig. 2.

In Fig. 2 is shown, for the purposes of illustration, a graphical and qualitative representation of the tuning field versus resonant frequency response of cavity 10 in Fig. 1. Curve 30 represents the tuning curve of cavity 10 in the absence of a compensating field. It can be seen that the resonant frequency of cavity 10 can be varied from frequency $f_2$ to a higher frequency $f_3$ by changing the tuning field from zero to a value $H_3$. Any attempt to tune the cavity beyond $f_3$ results in resonant absorption of the wave energy in element 15 such that the Q of the cavity becomes prohibitively low. Curve 31 represents the tuning curve of cavity 10 when a small compensating field is applied at right angles to the tuning field as shown in Fig. 1. In this case the resonant frequency of cavity 10 can be varied from frequency $f_1$, substantially lower than $f_2$, to the same higher frequency $f_3$ while the tuning field is varied through the same interval from zero to $H_3$. Again, an attempt to tune to a higher frequency results in high absorption losses. It is apparent that the tuning range of cavity 10 is increased by the addition of a compensating field to the extent of $f_2$ minus $f_1$. As shown in Fig. 2, this increase in tuning range can exceed 25 percent, giving a substantial extension of the possible applications of the magnetically tuned resonant cavity. Furthermore, as shown in Fig. 2, the response curve becomes substantially more linear, particularly in the low tuning field range, by the addition of a compensating field. In cavities similar to that shown in Fig. 1, tuning ranges of over 12 percent have been obtained with an unloaded Q of over 1000.

While the magnetically tuned resonant cavity shown in Fig. 1 is a rectangular cavity with a rectangular slab of gyromagnetic material along one of the narrower walls thereof, it should be noted that the present invention is by no means restricted to this configuration. As was noted above, to secure the advantages of the invention it is necessary only that the variable tuning field be applied perpendicular to the radio frequency magnetic flux loops in the gyromagnetic medium and that the compensating field be applied paralled to the principal radio frequency magnetic flux component in the gyromagnetic medium. Other configurations, representing alternative embodiments of the present invention, are shown in Figs. 3 through 6 and described below.

Figure 3:
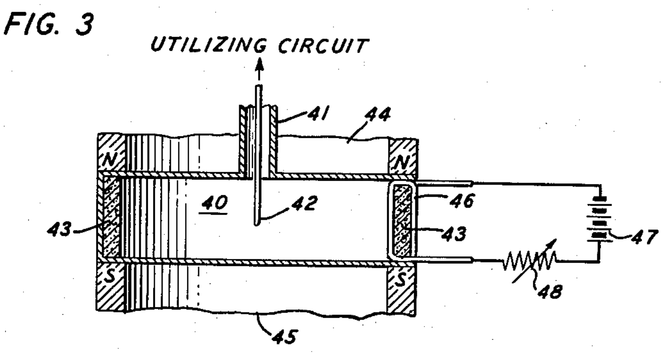
Fig. 3 is a cross-sectional view of another embodiment of the invention showing a "pillbox" type of resonant cavity containing compensated gyromagnetic material in accordance with the principles of the invention.

In Fig. 3 is shown as a second principal embodiment of the invention, a cross-sectional view of a magnetically tuned "pillbox" type of resonant cavity comprising a conductively bounded right circular cylindrical cavity 40 having a circular cross-section in the plane perpendicular to the plane of the paper and having a narrower dimension in the plane of the paper. Coaxial line 41 is coupled to cavity 40 by means of coupling probe 42 in Fig. 3, but energy may be coupled from cavity 40 by any of the means which are discussed with reference to Fig. 1 and are well known to the art. Enclosed within cavity 40 adjacent to the narrower wall thereof is an annular-shaped element 43 composed of gyromagnetic material similar to that of element 15 in Fig. 1. Element 43 extends entirely around the inner surface of the curved wall of cavity 40 and is closed upon itself. Element 43 is magnetically polarized by a tuning field of variable strength directed parallel to the narrower curved wall of cavity 40. In Fig. 3 this tuning field is provided by a magnetic structure having two circular-shaped pole pieces 44 and 45 resting on the broader faces of cavity 40 in the region of element 43. Pole pieces 44 and 45 are magnetized such that a north magnetic pole N is formed on pole piece 44 and a south magnetic pole S is formed on pole piece 45. Pole pieces 44 and 45 may, for example, be magnetized by turns of wire wound on a magnetic structure not shown, of which pole pieces 44 and 45 are a part.

When cavity 40 is excited in the dominant $TE_{101}$ mode, the field configuration in the cavity has a maximum electric field vector at the center of the broader faces directed parallel to the narrower curved wall and zero electric field at the outer narrower wall. The magnetic flux loops form concentric circles in planes perpendicular to the narrower wall of cavity 40. It can therefore be seen that the tuning field is directed along the electric field components of the wave energy in cavity 40 and perpendicular to the magnetic flux loops of the radio frequency wave energy.

In accordance with the present invention, a second magnetic field, the compensating field, is provided in element 43 directed along the radio frequency flux components within element 43. As shown in Fig. 3, this compensating field may be supplied by turns of wire 46 wound around one portion of element 43. Turns 46 are connected through rheostat 48 to energizing source 47 such that a magnetic field is created within element 43 directed circumferentially around element 43. Furthermore, since element 43 is closed upon itself, it forms a closed magnetic circuit and only a single or, at the most, a few turns of wire 46 are required to establish the required compensating field. This field may be generated by any other means well known to the art.

The resonator shown in Fig. 3 operates in much the same fashion as the rectangular cavity shown in Fig. 1. A small compensating field is introduced into element 43 by turns 46 to decrease the effective number of electron spins perpendicular to the radio frequency flux loops in cavity 40 when the tuning field is zero. This increases the effective permeability of element 43 at zero tuning field and thereby extends the resonant frequency tuning range. Since the biasing field is supplied electrically, it is not subject to any demagnetizing effects of the stronger tuning field. Furthermore, it is apparent that cavity 40 may be coupled directly to a reflex klystron through coupling apertures in the broader faces thereof in place of coupling probe 42.

Figure 4:
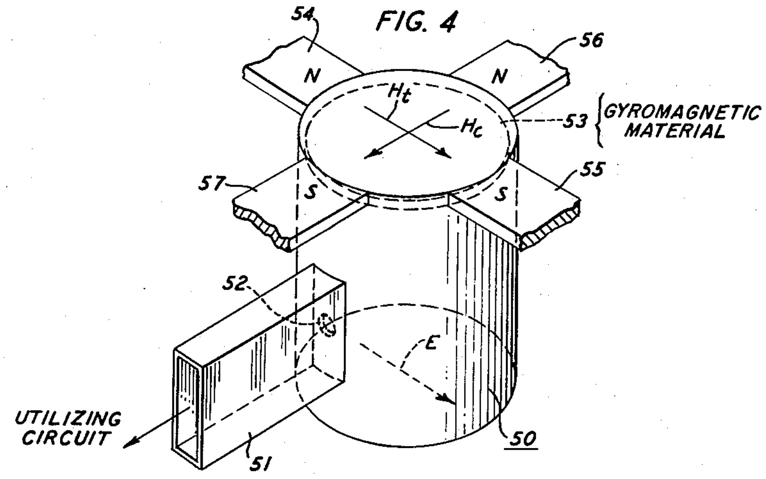
Fig. 4 is a perspective view of another principal embodiment of the invention showing a cylindrical resonant cavity containing compensated gyromagnetic material in accordance with the principles of the invention.

In Fig. 4 is shown another embodiment of the invention comprising a conductively bounded right circular cylindrical cavity 50 having a dimension perpendicular to the circular cross-section that is on the order of an integral multiple of half wavelengths of the frequency to be generated. Cavity 50 may, for example, be a section of round wave guide terminated by conductive plates at both ends. A section of rectangular wave guide 51 is coupled to cavity 50 by means of a coupling aperture 52. Enclosed within cavity 50 is a disc-shaped element 53 lying against one end of and of substantially the same diameter as cavity 50. Element 53 is composed of gyromagnetic material and is magnetically polarized in two perpendicular directions in its own plane. A first magnetic field is produced by one pair of pole pieces 54 and 55 and a second magnetic field is produced by another pair of pole pieces 56 and 57. If cavity 50 is excited in the dominant $TE_{111}$ mode with the electric vector E parallel to the narrower walls of guide 51, the field produced by pole pieces 54 and 55, directed along this electric vector, is used as a tuning field and means are provided for varying the intensity of this field. In this mode of oscillation, the radio frequency magnetic flux loops in cavity 50 lie in planes perpendicular to the narrower walls of guide 51 and hence, the tuning field, represented by the vector $H_t$, is perpendicular to these flux loops. In accordance with the invention, the second pair of pole pieces 56 and 57 produce a small magnetic field, represented by vector $H_c$, in the plane of the flux loops and directed along the principal flux component in element 53. This compensating field tends to decrease the electron spin alignment with the vector $H_t$ when the tuning field is zero and thereby extends the tuning range of cavity 50 in a manner similar to that described in connection with Fig. 1.

Figure 5:
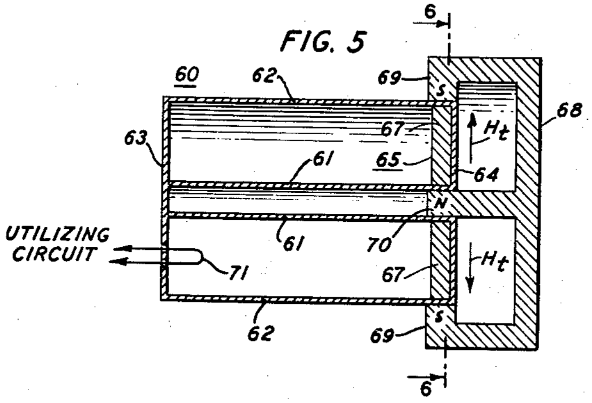
Fig. 5 is a cross-sectional view of another principal embodiment of the invention showing a coaxial resonant cavity containing compensated gyromagnetic material in accordance with the principles of the invention.

In Fig. 5 is shown a cross-sectional view of another embodiment of the invention comprising a section of coaxial line 60 having an inner cylindrical conductive member 61 and a concentric outer cylindrical conductor 62. Line 60 is terminated at its ends by conductive plates 63 and 64 at right angles to the axis of the line. By a proper choice of length of line 60, a coaxial resonant cavity is formed between plates 63 and 64 which may be excited in the dominant TEM mode. At one end of line 60 is an annular disc 65 to be more fully discussed in connection with Fig. 6. Disc 65 is magnetized in a radial direction from inner conductor 61 to outer conductor 62 by a magnetic field, represented by vectors $H_t$ and termed the tuning field of variable strength. As shown in Fig. 5, this field may be supplied by a magnetic structure 68 having two concentric cylindrical pole pieces 69 and 70. Pole piece 69 bears on the outer surface of conductor 62 in the region of disc 65 and pole piece 70 bears on the inner surface of conductor 61, also in the region of disc 65. Turns of wire, not shown, may be wound on magnetic structure 68 and connected to an energizing source so as to produce a north magnetic pole N at pole piece 70 and a south magnetic pole S at pole piece 69. The magnetic field of variable strength thus provided by magnetic structure 68 serves the same function as the tuning field provided by magnetic structure 13 of Fig. 1. A coupling loop 71 is inserted in line 60 to couple energy to and from line 60 and is connected to a utilizing circuit not shown.

When line 60 is excited in the dominant TEM mode, the field configuration within the cavity formed between plates 63 and 64 is such that the electric field vectors extend radially between inner conductor 61 and outer conductor 62. The radio frequency magnetic flux loops form concentric circles around inner conductor 61 in planes perpendicular to the axis of line 60. It can be seen that the tuning field provided by magnetic structure 68 is everywhere perpendicular to the radio frequency magnetic flux in disc 65.

Figure 6:
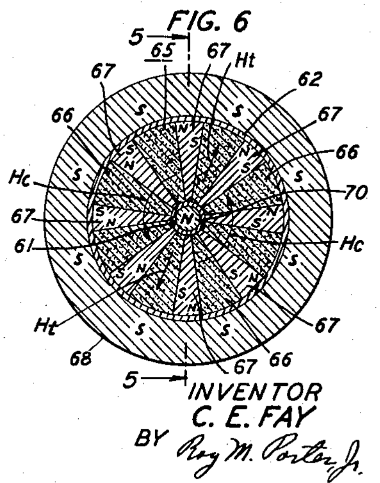
Fig. 6 is a cross-sectional view of the coaxial embodiment of the invention shown in Fig. 5.

In Fig. 6 is shown a cross-sectional view of the structure illustrated in Fig. 5. As shown in Fig. 6, disc 65 is composed of alternate sector-shaped elements 66 and 67. Elements 66 are composed of gyromagnetic material of the type disclosed in connection with element 15 in Fig. 1. Elements 67 are composed of permanent magnet material of the type represented by the trade name, "Ferroxdure" and discussed with respect to members 22 and 23 in Fig. 1. The high retentivity properties of these materials allow them to be permanently magnetized across the narrower dimension forming north magnetic poles N on the left-hand side of each element 67 and south magnetic poles S on the right-hand side of each of elements 67. This magnetic polarization will be retained by elements 67 even in the presence of strong magnetic fields at right angles to the permanent magnetization, such as, for example, the field $H_t$. Furthermore, due to the high resistivity of the Ferroxdure class of materials, elements 67 may be inserted completely within the line 60 without causing unduly large dissipation losses. It can be seen that the magnetic poles formed on elements 67 create magnetic fields $H_c$ in elements 66 which are in general directed in a circular fashion about inner conductor 61. In accordance with the present invention, the compensating field $H_c$ is of sufficient strength to substantially increase the effective permeability of elements 66 when $H_t$ is zero, thereby extending the tuning range of the cavity. It can be seen that $H_c$ is directed substantially along the radio frequency magnetic flux components in elements 66 and hence produces no gyromagnetic interaction itself.

The principal advantage of the coaxial cavity resonator shown in Figs. 5 and 6 resides in its ability to support lower frequencies than the same size cavity in other shapes. Furthermore, the coaxial cavity may be used to supply high frequency electromagnetic wave energy directly in the TEM coaxial mode used extensively for transmission purposes.

In all cases, it is understood that the above-described arrangements are simply illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. A resonant circuit for electromagnetic wave energy within a given frequency band comprising a cavity resonator defined by substantially closed conductive boundaries and adapted to support at least one standing wave mode over said frequency band having magnetic field loops lying in planes, a magnetically polarizable medium which exhibits gyromagnetic effects at frequencies within said frequency band disposed within said cavity in the presence of portions of said magnetic field loops which extend in a predominant direction, means including a source of microwaves external to said cavity for exciting said cavity in said standing wave mode over said frequency band electrically coupled to said cavity, and means for varying the resonant frequency of said cavity including first magnetic structure means for applying a first magnetic polarizing field having a strength within a given range to said medium in a direction normal to said portions of said magnetic field loops within said medium for all operating conditions in order to control the permeability presented by said gyromagnetic medium to said wave mode, said first magnetic structure means being separate and distinct from said exciting means, said given range of field strengths including those strengths for which said cavity is resonant at the lower frequencies of said band, and second magnetic structure means for applying a second magnetic polarizing field to said medium in a direction orthogonal to the direction of said first magnetic polarizing field and parallel to said portions of said magnetic field loops within said medium for all field strength values of said first magnetic polarizing field in order to extend the tuning range of said cavity to said lower frequencies of said band in response to field strength variations of said first magnetic polarizing field, said second magnetic structure means being separate and distinct both from said exciting means and from said first magnetic structure means.

2. The combination according to claim 1 in which said boundaries define a region having a rectangular transverse cross section with one narrower dimension and two broader dimensions, said medium being positioned along at least one portion of said narrower dimension.

3. The combination according to claim 1 in which said boundaries define a cylindrical region, said medium extending along one of said boundaries.

4. The combination according to claim 3 in which said cylindrical region comprises a right circular cylinder having a height substantially less than the diameter thereof, said medium comprising an annular-shaped element located adjacent to the curved surface of said cylinder.

5. The combination according to claim 1 in which two of said boundaries comprise coaxial cylindrical members, said medium comprising an annularly-shaped element extending between said members.

6. The combination according to claim 1 including at least one permanently magnetized element of anisotropic barium iron oxide located adjacent to said medium.

7. A resonant circuit for electromagnetic wave energy within a given frequency band comprising a cavity resonator defined by substantially closed conductive boundaries and adapted to support at least one standing wave mode over said frequency band having magnetic field loops lying in planes, a magnetically polarizable medium which exhibits the gyromagnetic effect at frequencies within said frequency band disposed within said cavity adjacent one of said boundaries in a region in which said wave mode is characterized by maximum magnetic intensity and by portions of said magnetic field loops which extend in a predominant direction, means including a source of microwaves external to said cavity for exciting said cavity in said standing wave mode over said frequency band electrically coupled to said cavity, and means for varying the resonant frequency of said cavity including first magnetic structure means for applying a first magnetic polarizing field having a strength within a given range to said medium in a direction normal to said portions of said magnetic field loops within said medium in order to control the permeability presented by said gyromagnetic medium to said wave mode, said first magnetic structure means being separate and distinct from said exciting means, said given range of field strengths including those strengths for which said cavity is resonant at the lower frequencies of said band, and second magnetic structure means for applying a second magnetic polarizing field to said medium in a direction orthogonal to the direction of said first magnetic polarizing field and parallel to said portions of said magnetic field loops within said medium in order to extend the tuning range of said cavity to said lower frequencies of said band in response to field strength variations of said first magnetic polarizing field, said second magnetic structure means being separate and distinct both from said exciting means and from said first magnetic structure means.

References Cited in the file of this patent

UNITED STATES PATENTS

| | | |
|---|---|---|
| 2,051,537 | Wolff et al. | Aug. 18, 1936 |
| 2,402,948 | Carlson | July 2, 1946 |
| 2,700,147 | Tucker | Jan. 18, 1955 |
| 2,705,790 | Hahn | Apr. 5, 1955 |
| 2,743,322 | Pierce et al. | Apr. 24, 1956 |
| 2,757,359 | Anderson et al. | July 31, 1956 |
| 2,784,378 | Yager | Mar. 5, 1957 |
| 2,802,183 | Read | Aug. 6, 1957 |
| 2,820,200 | Du Pre | Jan. 14, 1958 |
| 2,825,765 | Marie | Mar. 4, 1958 |
| 2,845,565 | Leete | July 29, 1958 |
| 2,873,370 | Pound | Feb. 10, 1959 |

FOREIGN PATENTS

| | | |
|---|---|---|
| 674,874 | Great Britain | July 2, 1952 |

OTHER REFERENCES

"Reduction of Loss in Ferrite Materials in the Microwave Region," Journal of Applied Physics, January 1953, vol. 24, No. 1.